(12) United States Patent
Xu et al.

(10) Patent No.: US 10,627,446 B2
(45) Date of Patent: *Apr. 21, 2020

(54) IMPORTANCE SAMPLING METHOD FOR MULTIPLE FAILURE REGIONS

(71) Applicant: Samsung Electronics Co., Ltd., Suwon-si, Gyeonggi-do (KR)

(72) Inventors: Nuo Xu, Milpitas, CA (US); Jing Wang, San Jose, CA (US); Woosung Choi, Pleasanton, CA (US)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/406,868

(22) Filed: May 8, 2019

(65) Prior Publication Data
US 2019/0265296 A1   Aug. 29, 2019

Related U.S. Application Data

(63) Continuation of application No. 15/365,808, filed on Nov. 30, 2016, now Pat. No. 10,330,727.

(Continued)

(51) Int. Cl.
*G01R 31/317* (2006.01)
*G01R 31/3193* (2006.01)
(Continued)

(52) U.S. Cl.
CPC ... *G01R 31/31718* (2013.01); *G01R 31/2894* (2013.01); *G01R 31/3177* (2013.01); *G01R 31/31937* (2013.01)

(58) Field of Classification Search
CPC ...... G01R 31/31718; G01R 31/318342; G01R 31/31835; G01R 31/318357;
(Continued)

(56) References Cited

U.S. PATENT DOCUMENTS 5,579,251 A * 11/1996 Sato ................ G01R 31/31922
                                                     702/117
7,493,574 B2   2/2009 Liu et al.
(Continued)

OTHER PUBLICATIONS

Sun et al., Efficient SRAM Failure Rate Prediction via Gibbs Sampling, IEEE Transactions on Computer-Aided Design of Integrated Circuits and System, vol. 31, Issue 12, pertinent pp. 1831-1844 (Year: 2012).*

(Continued)

*Primary Examiner* — Cynthia Britt
*Assistant Examiner* — Dipakkumar B Gandhi
(74) *Attorney, Agent, or Firm* — Lewis Roca Rothgerber Christie LLP

(57) ABSTRACT

In a method of circuit yield analysis, the method includes: detecting a plurality of failed samples respectively located at a plurality of failure regions in a multi-dimensional parametric space; clustering the failed samples to identify the failure regions; filtering features of the failed samples to determine a parameter component that is a non-principal component in affecting circuit yield; applying a dimensional reduction method on a dimension corresponding to the parameter component; and constructing a final importance sampling (IS) distribution function using a mixed Gaussian (mGaussian) function corresponding to all of the failure regions containing a rare failure event.

21 Claims, 8 Drawing Sheets

Related U.S. Application Data

(60) Provisional application No. 62/395,334, filed on Sep. 15, 2016.

(51) Int. Cl.
*G01R 31/28* (2006.01)
*G01R 31/3177* (2006.01)
*G01R 31/34* (2020.01)

(58) Field of Classification Search
CPC .... G01R 31/318364; G01R 31/318371; G01R 31/3177; G01R 31/31937; G01R 31/2894
See application file for complete search history.

(56) References Cited

U.S. PATENT DOCUMENTS

| | | | |
|---|---|---|---|
| 8,219,355 B2 | 7/2012 | Tiwary et al. | |
| 8,509,517 B2 | 8/2013 | Blanton et al. | |
| 8,601,416 B2 | 12/2013 | Kuo et al. | |
| 2001/0035766 A1* | 11/2001 | Nakajima | G01R 31/2851 324/762.02 |
| 2002/0063556 A1* | 5/2002 | Johnson | G01R 31/31937 324/754.19 |
| 2002/0184581 A1* | 12/2002 | Komatsu | G01R 31/31922 714/724 |
| 2004/0056677 A1* | 3/2004 | Rajsuman | G01R 31/31903 324/756.03 |
| 2004/0174939 A1 | 9/2004 | Wang | |
| 2006/0184461 A1 | 8/2006 | Mori | |
| 2007/0035322 A1* | 2/2007 | Kang | G01R 31/31718 324/762.05 |
| 2009/0058444 A1* | 3/2009 | McIntyre | G01R 31/31718 324/762.02 |
| 2010/0148808 A1* | 6/2010 | Butler | G01R 31/3004 324/750.3 |
| 2011/0153271 A1 | 6/2011 | Tiwary et al. | |
| 2012/0039508 A1 | 2/2012 | Cao et al. | |
| 2012/0212246 A1* | 8/2012 | Benjamin | G01R 31/2874 324/750.03 |
| 2013/0246986 A1 | 9/2013 | Kuo et al. | |
| 2014/0157073 A1* | 6/2014 | Douskey | G01R 31/3177 714/732 |
| 2014/0278309 A1 | 9/2014 | Joshi et al. | |
| 2015/0302310 A1 | 10/2015 | Wernevi et al. | |
| 2016/0063156 A1 | 3/2016 | Joshi et al. | |
| 2016/0224705 A1 | 8/2016 | Joshi et al. | |
| 2017/0059649 A1 | 3/2017 | Joshi et al. | |

OTHER PUBLICATIONS

Yu et al., Maximum likelihood estimation for failure analysis [IC yield], IEEE Transaction on Semiconductor Manufacturing, vol. 11, Issue 4, pertinent pp. 681-691 (Year: 1998).*

Allan, Gerard A., "Yield Prediction by Sampling IC Layout", IEEE Transactions on Computer-Aided Design of Integrated Circuits and Systems, vol. 19, No. 3, Mar. 2000, pp. 359-371.

\* cited by examiner

IMPORTANCE SAMPLING METHOD FOR MULTIPLE FAILURE REGIONS

CROSS-REFERENCE TO RELATED APPLICATIONS

The present application is a continuation of U.S. patent application Ser. No. 15/365,808, filed Nov. 30, 2016, which claims priority to, and the benefit of, U.S. Provisional Application 62/395,334, filed on Sep. 15, 2016 in the U.S. Patent and Trademark Office, the entire content of each of which is incorporated herein by reference.

FIELD

One or more aspects of embodiments according to the present invention generally relate to a method for improving efficiency and accuracy of importance sampling Monte Carlo (ISMC) simulations by reducing a number of simulations needed to identify and analyze multiple rare failure events affecting product yield, and a system for performing the same.

BACKGROUND

In the field of integrated circuit (IC) yield analysis, it has become increasingly challenging to evaluate very rare failure events (i.e., rarely occurring failure events) when a more of process variability sources exist. Failure rates at "high-sigma" tails of a distribution (e.g., $6\sigma$ or higher) are important, as an array demands billions of life cycles, and because failure of even only a few cells could be catastrophic. For example, for a 1 Mb memory block, to achieve yield of 90%, each individual memory cell of the memory block may require a failure rate that is less than 1e-7. To ensure capture of an incredibly rare failure event at a simulation-based evaluation/validation stage, more than 1e9 standard Monte Carlo (MC) simulations may be required.

SUMMARY

Aspects of embodiments of the present disclosure are directed toward a method for improving importance sampling Monte Carlo simulation (ISMC) efficiency and accuracy, and toward a system for performing the same.

According to an embodiment of the present invention, there is provided a method of circuit yield analysis for evaluating rare failure events existing in multiple disjoint failure regions defined by a multi-dimensional parametric space, the method including performing initial sampling to detect failed samples respectively located at multiple failure regions in the multi-dimensional parametric space, performing clustering to identify the failure regions, performing feature filtering to determine which parameter component is a non-principal component in affecting circuit yield, applying a dimensional reduction method on a dimension corresponding to the parameter component, optimizing an importance sampling (IS) distribution function corresponding to each of the failure regions, and constructing a final importance sampling (IS) distribution function using a mixed Gaussian (mGaussian) function corresponding to all of the failure regions.

The method may further include collecting the failed samples at each failure region, and calculating a final failure probability.

Performing initial sampling may include performing at least one of uniform sampling, orthogonal sampling, Latin-Hypercube sampling, or Sobol sampling.

Performing clustering may include performing at least one of hierarchical clustering, K-means clustering, Expectation-Maximization clustering, or density-based clustering.

Performing clustering may include using evaluation algorithms to score and determine a clustering strategy.

Using evaluation algorithms may include using at least one of a Davis-Bouldin index, a Dunn index, a Jaccard index, an F-measure, or a Silhouette coefficient.

Optimizing the importance sampling (IS) distribution function corresponding to each of the failure regions may include performing at least one of sequential importance sampling, probability collectives, or regression-based sampling.

The method may further include parameterizing the mGaussian function.

Parameterizing the mGaussian function may include performing at least one of closed-form calculations or convolutional calculations.

Applying the dimensional reduction method may include at least one of principal-component-analysis or filtering.

According to another embodiment of the present invention, there is provided a system for circuit yield analysis for evaluating rare failure events existing in multiple disjoint failure regions defined by a multi-dimensional parametric space, the system including a processor, and a memory having instructions stored thereon that, when executed by the processor, cause the processor to perform initial sampling to detect failed samples respectively located at multiple failure regions in the multi-dimensional parametric space, perform clustering to identify the failure regions, perform feature filtering to determine which parameter component is a non-principal component in affecting circuit yield, apply a dimensional reduction method on a dimension corresponding to the parameter component, optimize an importance sampling (IS) distribution function corresponding to each of the failure regions, and construct a final importance sampling (IS) distribution function using a mixed Gaussian (mGaussian) function corresponding to all of the failure regions.

The instructions, when executed by the processor, may further cause the processor to collect the failed samples at each failure region, and calculate a final failure probability.

The instructions, when executed by the processor, may cause the processor to perform the initial sampling by performing at least one of uniform sampling, orthogonal sampling, Latin-Hypercube sampling, or Sobol sampling.

The instructions, when executed by the processor, may cause the processor to perform the clustering by performing at least one of hierarchical clustering, K-means clustering, Expectation-Maximization clustering, or density-based clustering.

The instructions, when executed by the processor, may cause the processor to perform the clustering by using evaluation algorithms to score and determine a clustering strategy.

The instructions, when executed by the processor, may cause the processor to optimize the importance sampling (IS) distribution function corresponding to each of the failure regions by performing at least one of sequential importance sampling, probability collectives, or regression-based sampling.

The instructions, when executed by the processor, may further cause the processor to parameterize the mGaussian function.

The instructions, when executed by the processor, may cause the processor to parameterize the mGaussian function by performing at least one of closed-form calculations or convolutional calculations.

The instructions, when executed by the processor, may cause the processor to apply the dimensional reduction method by at least one of principal-component-analysis or filtering.

According to yet another embodiment of the present invention, there is provided a method of circuit yield analysis for evaluating multiple disjoint failure regions defined by a multi-dimensional parametric space, the method including identifying the multiple failure regions, and constructing a final importance sampling (IS) distribution function using a mixed Gaussian (mGaussian) function corresponding to all of the failure regions.

BRIEF DESCRIPTION OF THE DRAWINGS

These and other aspects of embodiments of the present invention will be appreciated and understood with reference to the specification, claims, and appended drawings wherein:

DETAILED DESCRIPTION

Figure 1A:
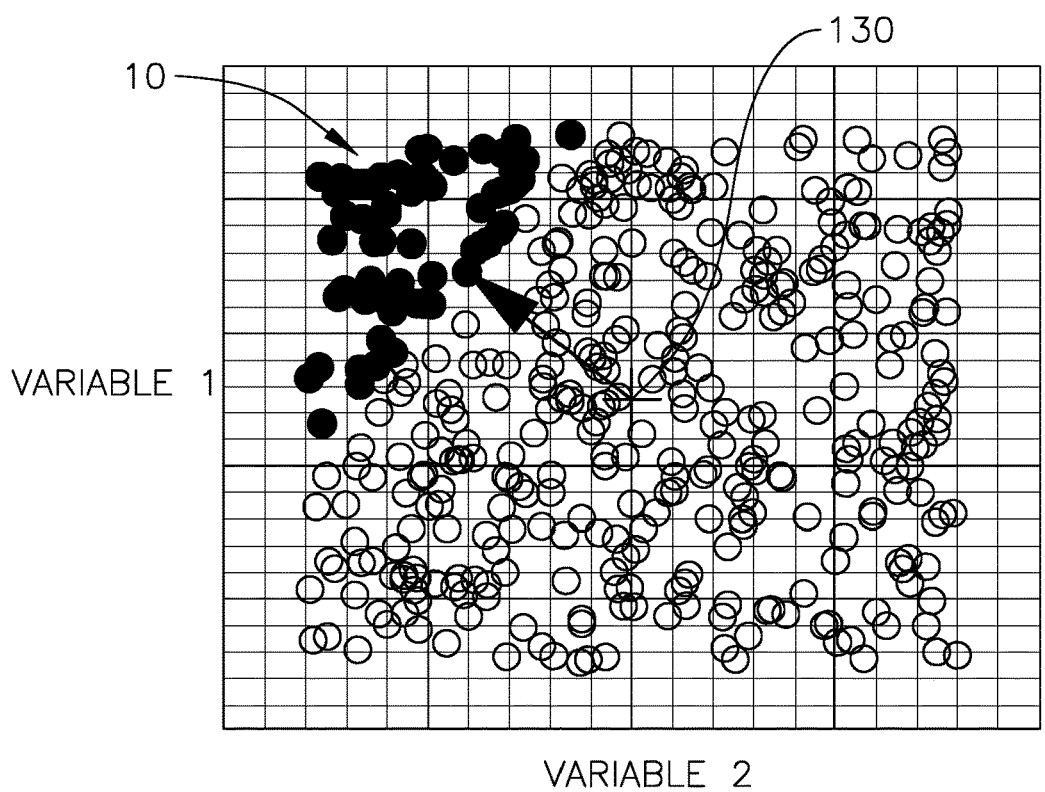
FIG. 1A depicts a uniform sampling of uniformly distributed samples according to an importance sampling algorithm for detecting a failure region corresponding to failed samples, according to an embodiment of the present invention.

Aspects of embodiments of the present disclosure are directed toward a method for improving importance sampling Monte Carlo simulation (ISMC) efficiency and accuracy, and toward a system for performing the same.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the described embodiments.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Due to the high number of MC simulations that may be required for detection of incredibly rare failure events, importance sampling (IS) algorithms have been proposed and extensively studied for the purpose of reducing a total number of MC simulations needed to detect the rare failure events. The intent behind such studies is to shift and reshape, or modify, a distribution function (e.g., a Gaussian function) to move deeply into a failure region corresponding to, or encompassing, these rarely occurring failure events, thereby largely reducing variance occurring within an MC simulation for a given number of random draws. Because an IS distribution function includes information related to the cause of deviation from the original distribution function (e.g., by calculating a corresponding weight), the rare failure events occurring at a low rate, thus, can be evaluated within standard MC simulation times in accordance with a standard MC simulation budget (e.g., within a standard number of MC simulations).

Accordingly, a sampling distribution function may be modified from an original distribution function to shift the mean value, and to reshape the original distribution function to thereby change the sigma ($\square$) (i.e., to reshape the original distribution function toward/into the failure region), thereby placing a higher percentage of the samples at one or more failure corners/failure regions.

For example, one or more failure regions may be initially detected, and then the original distribution function may be shifted and reshaped toward the failure region(s) such that a larger number of samples at the failure region(s) can be detected in a same number of simulations. Hence, more accuracy may be achieved despite using the same simulation budget (i.e., despite running the same number of MC simulations), due to more samplings being focused in the failure region(s), thereby reducing simulation variance from MC simulations.

When MC simulation is used as a method of sampling, as a method of averaging, or as an integration method, some variance results due to the random nature of MC simulations. According to example embodiments of the present invention, variance may be reduced and accuracy may be improved at very low failure rates with a comparable, or even reduced, simulation budget.

According to example embodiments of the present invention, a "related art" probability-collective based IS algorithm is used as shown below. The IS algorithm and the application thereof is known to those of ordinary skill in the art.

First, $N_1$ uniformly distributed samples $\xi^j=(\xi_1^j, \ldots, \xi_M^j)$ are drawn from a given distribution function $N(\mu, \sigma)$, and MC simulations are run to identify samples occurring in failure regions (e.g., to identify failure samples) and to calculate the L2-norm values of the failure samples with reference to the mean. Then, one of the failed samples that has a minimum L2-norm is chosen as used as an initial shift vector of $\mu^1 * \sigma^1$.

Thereafter, $N_2$ samples are drawn from an initial parameterized distribution $h(\xi, \mu^1, \sigma^1)$, and the iteration index may be set at 2 (e.g., t=2).

Then, an indicator function $I(\xi^j)$ may be evaluated with the $N_2$ samples. Thereafter, the mean(s) and the sigma(s) may be calculated throughout the multiple dimensions of a parameterized space corresponding to the samples. The mean(s) and the sigma(s) may respectively be calculated by the following equations:

$$\mu_i^t = \frac{\sum_{j=1}^{N} I(\xi^j) \cdot \omega(\xi^j, \mu_i^{t-1}, \sigma_i^{t-1}) \cdot \xi^j}{\sum_{j=1}^{N} I(\xi^j) \cdot \omega(\xi^j, \mu_i^{t-1}, \sigma_i^{t-1})} ; \text{ and}$$

$$\sigma_i^t = \sqrt{\frac{\sum_{j=1}^{N} I(\xi^j) \cdot \omega(\xi^j, \mu_i^{t-1}, \sigma_i^{t-1}) \cdot (\xi^j - \mu_i^t)^2}{\sum_{j=1}^{N} I(\xi^j) \cdot \omega(\xi^j, \mu_i^{t-1}, \sigma_i^{t-1})}}$$

Then, another batch of N2 samples may be drawn from the updated parameterized distribution, and the iteration index, t, may be set as t+1 until convergence occurs (e.g., when the means and the sigmas are within an error tolerance).

Finally, $N_3$ samples may be drawn from the obtained optimal, or improved, sampling distribution $h(\xi, \hat{\mu}, \hat{\sigma})$, and MC simulations may be run to identify failure samples. The failure probability may be expressed by the following equation:

$$P_r = \frac{1}{N_3} \sum_{j=1}^{N_3} I(\xi^j) \cdot \frac{\prod_{i=1}^{M} h(\xi_i^j)}{\prod_{i=1}^{M} h(\xi_i^j, \hat{\mu}, \hat{\sigma})}$$

However, although embodiments of the present invention utilize IS algorithms for circuit yield analysis, it should be noted that the present invention is not limited to the IS algorithm shown above. In other embodiments, improvement of the IS algorithms may be achieved by other existing methods known to those skilled in the art, such as regression-based sampling and/or sequential importance sampling, etc.

Figure 1B:
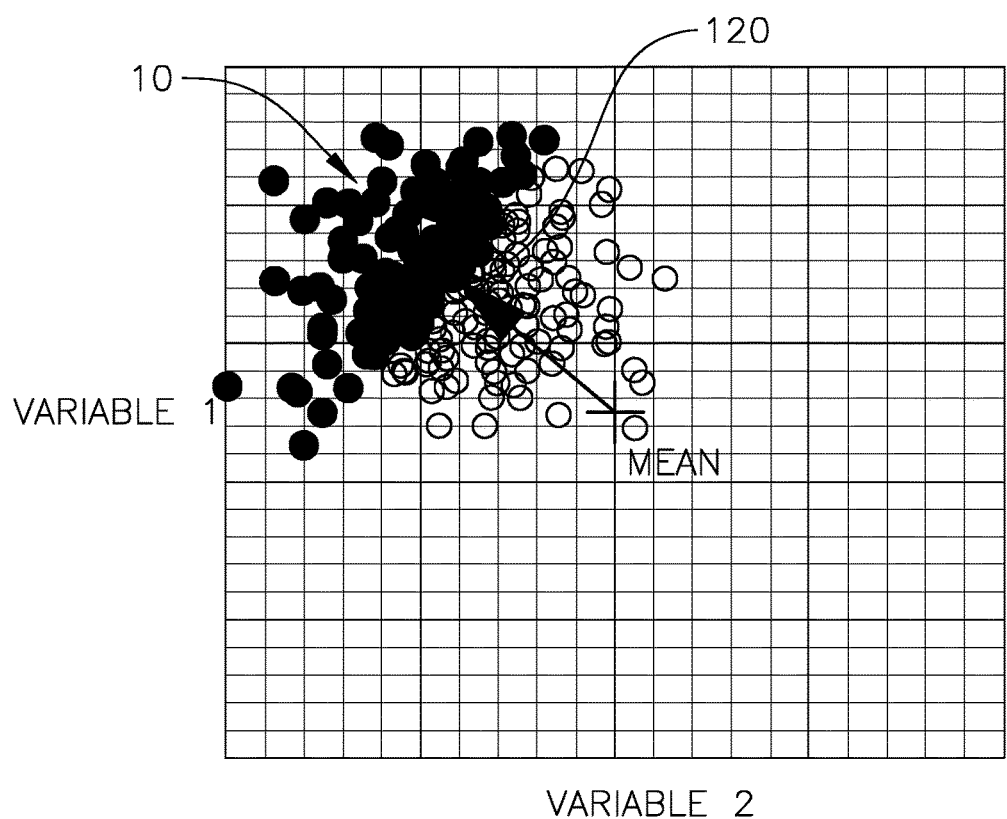
FIG. 1B depicts a targeted sampling of non-uniformly distributed samples focused on the failure region detected by the uniform sampling of FIG. 1A.

FIG. 1A depicts a uniform sampling of uniformly distributed samples according to an importance sampling algorithm for detecting a failure region corresponding to failed samples, according to an embodiment of the present invention, and FIG. 1B depicts a targeted sampling of non-uniformly distributed samples focused on the failure region detected by the uniform sampling of FIG. 1A.

Referring to FIGS. 1A and 1B, for example, by comparing the sample distributions of FIG. 1A and FIG. 1B, it can be shown that by focusing the simulations at a failure region 110 at the upper left quadrant (i.e., second quadrant), as shown in FIG. 1B, a larger number of failure samples (e.g., higher percentage of samples) are detected at the failure region in the graph of FIG. 1B than in the graph of FIG. 1A. This may be achieved by shifting the mean 120 from the center 130, as shown in FIG. 1A, toward the failure region 110.

Figure 2:
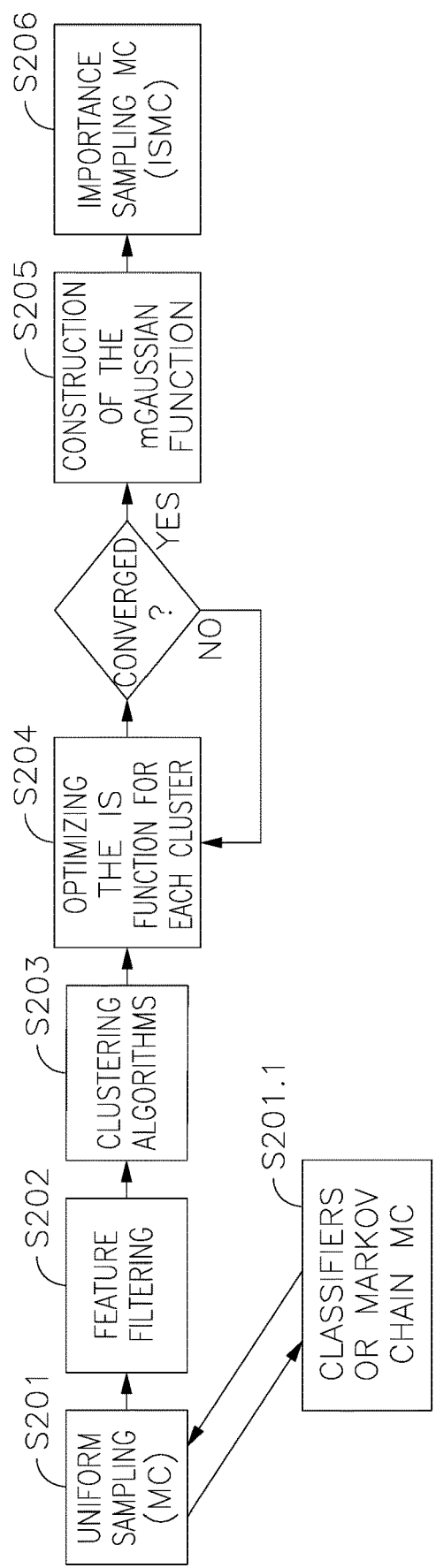
FIG. 2 depicts a flowchart of a method for constructing a mixed Gaussian function for focusing on multiple failure regions to improve importance sampling Monte Carlo simulations, according to an embodiment of the present invention.

FIG. 2 depicts a flowchart of a method for constructing a mixed Gaussian function for focusing on multiple failure regions to improve importance sampling Monte Carlo simulations, according to an embodiment of the present invention.

Referring to FIG. 2, and also in reference to the importance sampling (IS) algorithms discussed above, although there are multiple different IS methods, embodiments of the present invention introduce improved IS methods, and also introduce methods for improving redistribution or resampling functions (e.g., Gaussian redistribution/resampling functions) to generate a modified redistribution/resampling function. Although uniform sampling is described in the present embodiment, other forms of sampling, such as orthogonal sampling, Latin-Hypercube sampling, or Sobol sampling, may instead be used to detect one or more failure regions. According to the IS algorithm discussed above, a uniform sampling is performed to draw, or sample, N1 uniformly distributed samples (e.g., see FIG. 1A).

At S201, a uniform sampling of Monte Carlo simulations (i.e., a randomly sampling not limited to any area in the parametric space defined) may be performed to detect failed samples. However, uniform sampling may not be practical (e.g., because of unacceptably high variance or an unacceptable large number of variations) for an IC yield analysis involving multiple failure regions. However, at S201, because uniformly distributed samples cover an entirety of a corresponding space (or regions), failure regions or corners (i.e., regions or corners at which failed samples are mainly located) may be detected.

Optionally, at S201.1, the uniform sampling may be combined with advanced MC techniques, such as classifiers, statistical blockade or Markov Chain MC (MCMC) methods, etc.

At S202, feature filtering may be performed to handle high-dimensional problems by determining which variables/parameters are non-principal components (NPCs) in affecting the circuit yield, thereby enabling the suppression of the impact of such variables by using dimensional reduction techniques to reduce the MC variance at high dimensions with limited sampling events during optimization/improvement of a corresponding IS distribution function. That is, suppression of the impact of the non-principal components may be thought of as a "dimension reduction" technique to enable determination of which variables are non-principal components in affecting the circuit yield, so that the impacts of these variables on the analysis may be suppressed during the improvement of the IS distribution function. Accordingly, the feature filtering allows for efficient analysis of a high-dimension problem having very low variance.

At S203, clustering algorithms may be used to group different, separate failed samples into respective disjoint failure regions. That is, at S201, sometimes it may be apparent after drawing N1 uniformly distributed samples that, instead of a single failure region, multiple, distinct failure regions exist (e.g., see the multiple failure regions shown in FIG. 5, discussed further below). However, the detection of multiple failure regions indicates that a corresponding number of Gaussian distributions may be needed to cover all of the detected failure regions (e.g., one Gaussian distribution function per failure region). To "contourize" the Gaussian function, the present embodiment provides techniques for automatically determining methods for adjusting the Gaussian function, and methods for optimizing/improving the Gaussian distribution for each failure region, even for a sample having a large number of variables (i.e., very high dimensions in the parametric space) to allow for more rapid convergence of mean and sigma values despite growing variance.

In the present embodiment, a clustering method may be used, as opposed to a classification method, as resources need not be spent to generate boundaries between the successful samples and the failed samples (e.g., to isolate the failure regions) in a clustering method. For example, in machine learning, or statistical learning, upon detection of the failure regions, a classification approach requires generation of a function for classifying, or distinguishing, failed samples and successful samples. Such an approach may require a relatively high level of effort to generate an accurate boundary to identify failure regions. Additionally, a scoring strategy may be used to evaluate which clustering algorithm is suitable, and what number of failure regions should be individually identified.

Figure 3A:
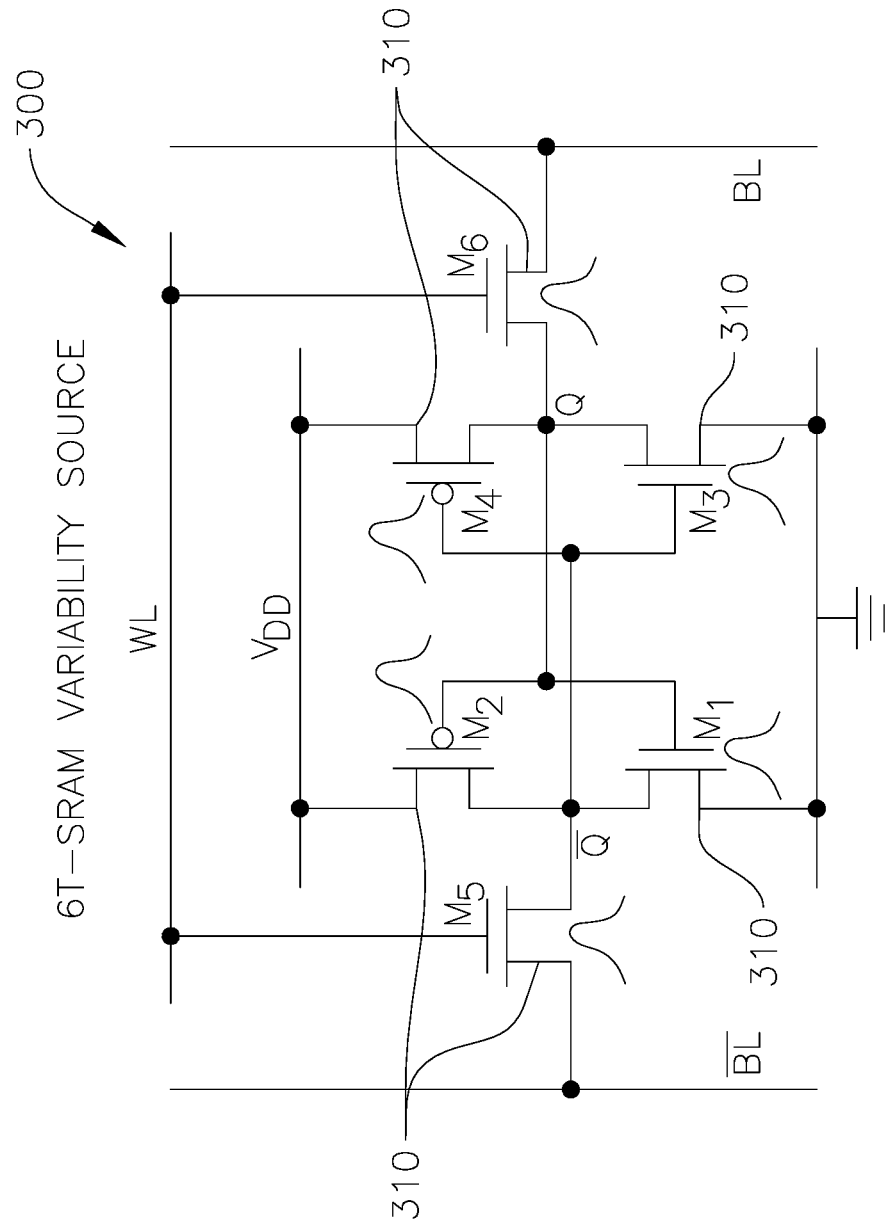
FIG. 3A depicts a circuit diagram of a 6T-SRAM circuit.
Figure 4:
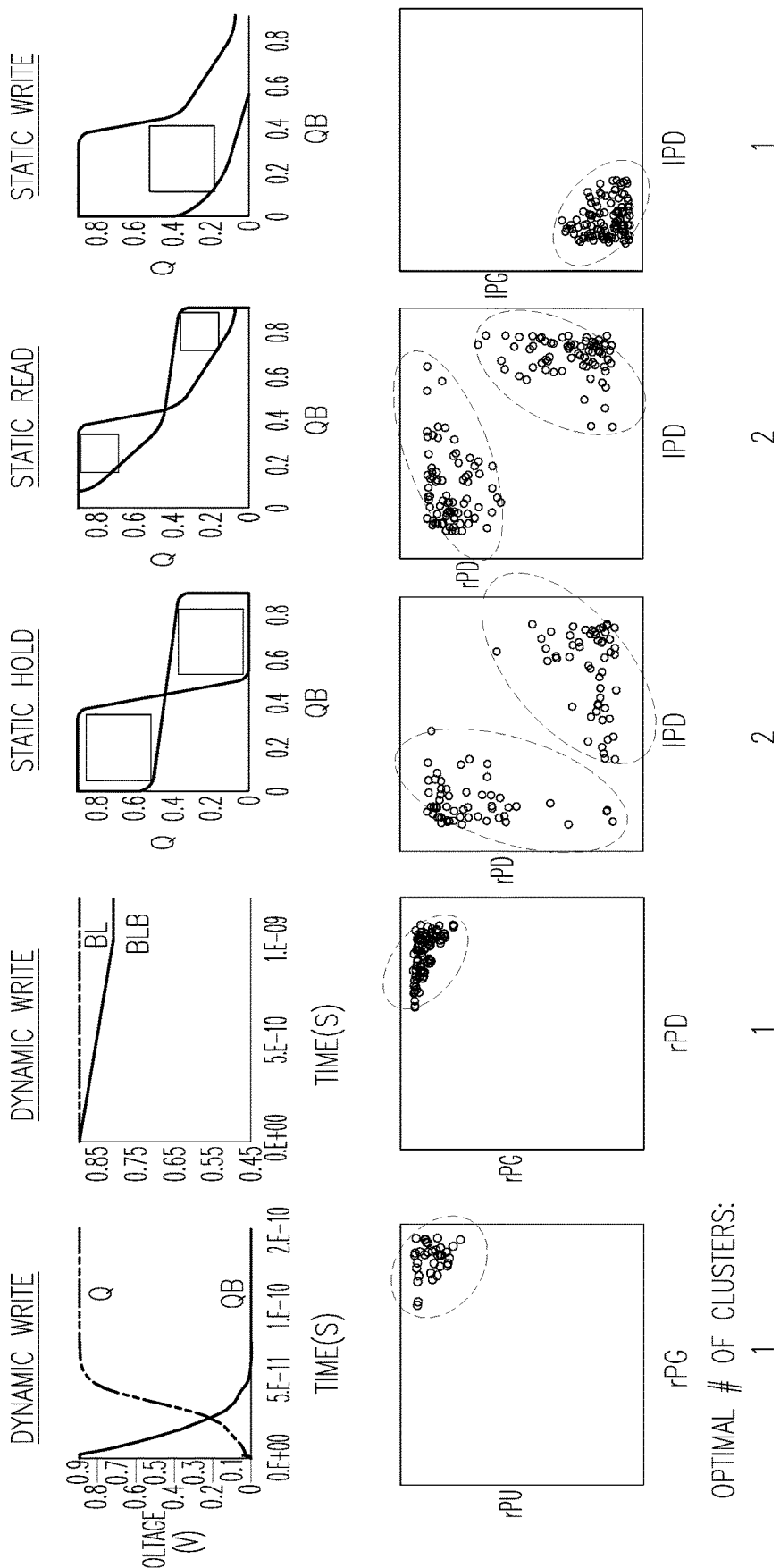
FIG. 4 depicts identification of possible failure regions for different variables corresponding to the 6T-SRAM circuit of FIG. 3 as identified using the method of FIG. 2, according to an embodiment of the present invention.

In IC yield analysis, due to the existence of multiple devices (e.g. the existence of 6 transistors in an SRAM cell, as depicted in FIG. 3A), and due to IC topology (e.g. pull-down (PD), pull-up (PU), and pass-gate (PG) pairs, some of which being depicted in FIG. 4), the multiple failure regions may often be disconnected from each other in the high variable/multi-dimensional parametric space. The embodiments described herein overcome limitations of existing ISMC algorithms, which lack the efficiency and accuracy achieved herein. These limitations may be overcome using unsupervised learning/clustering algorithms at S203. Self-learning algorithms that have been adopted in the machine-learning community may also be applied.

For example, a K-Means clustering algorithm may partition N samples $X \in \mathbb{R}^{N \times M}$ into K disjoint clusters in which each sample belongs to the cluster with the nearest mean. K-Means clustering may be achieved by first determining the value K, and by randomly initializing cluster centroids $\mu_1 \ldots \mu_K \in \mathbb{R}^M$. This process may be repeated at a $t^{th}$ iteration, and for each i, the equation may be set as $c^i = \arg\min_j \|x^i - \mu_j\|^2$, while for each j, the equation may be set as $$\mu_i^{t+1} = \frac{\sum_{i=1}^{N} I(c^i = j) \cdot x^i}{\sum_{i=1}^{N} I(c^i = j)}$$

until convergence occurs (i.e. when $\mu_i^t$ are within the error tolerance).

As part of the K-Means clustering algorithms used in this invention, the optimal value of K may be determined by some scoring strategy, and the "Silhouette" score is utilized herein to measure how similar each sample is to its own cluster when compared to the degree of similarity of other samples to their respective cluster, thereby allowing a determination of whether the current K-means clustering strategy is optimal. In the present example, the equation $$S(i) = \frac{b(i) - a(i)}{\max\{a(i) - b(i)\}}$$

may be used, where b(i) is a lowest average dissimilarity of sample i to any other cluster of which i is not a member, and where a(i) is an average dissimilarity of sample i to its assigned cluster. According to the above definition, $S(i) \in [0,1]$.

Furthermore, it should be noted that other existing clustering algorithms may be used in embodiments of the present invention, such as Expectation Maximization (EM), hierarchical clustering, density-based spatial clustering of applications with noise (DBSCAN), one-class Support Vector Machine (SVM), and Artificial Neural Network (ANN), etc. Additionally, evaluation algorithms, such as a Davis-Bouldin index, a Dunn index, a Jaccard index, an F-measure, or a Silhouette coefficient, may be used to score the clustering algorithms.

At S204, upon detection of the failure regions, the IS distribution function for each individual failure cluster may be improved (e.g., individually). For example, mathematical algorithms may be used to improve/optimize each IS function distribution function based on information corresponding to a respective failure region. For example, a mean value of the sample distribution algorithm, as well as a sigma value of the sample distribution algorithm, may be updated based on the detected failure regions. Accordingly, through an iterative process, an improved/optimal distribution function/sampling function may be generated. During the iterative process, N2 samples are drawn or sampled until both mean and sigma values converge to be within an error tolerance. Furthermore, probability collectives (PC) and/or minimum L1/2 norms may be used to improve or optimize the IS distribution function for each disjoint failure region.

Until convergence occurs, the method of the present embodiment may repeat S204 to further improve the IS function for each of the clusters of failed samples (e.g., each of the failure regions) determined at S203. Accordingly, S202, S203, and S204 provide a novel methodology to handle the "multiple-failure-region" problems existing in IC yield analysis.

After applying the clustering algorithms (e.g. K-means, as mentioned later) to optimize the mean and sigma values for each failure cluster, the final resampling function can be expressed as: $g(\vec{\xi}) = \sum_{i=1}^{K} w_i N(\vec{\mu}_i, \vec{\sigma}_i)$ where $\hat{\mu}, \hat{\sigma} \in \mathbb{R}^{K \times M}$ are the mean and sigma tensors for failed samples at each cluster and $w_i$s follow $\sum_{i=1}^{K} w_i = 1$ are the normalized cluster weights that can be calculated as $$w_i = \frac{1}{Z} \int_{\vec{\mu}_i - a\vec{\sigma}_i}^{\vec{\mu}_i + a\vec{\sigma}_i} N\left(\vec{\mu}_0, \vec{\sigma}_0\right) N\left(\vec{\mu}_i, \vec{\sigma}_i\right) d\vec{\xi}$$

At S205, upon convergence of the mean and sigma values, a mixture of Gaussian distributions (mGaussian distributions) may be constructed as a final IS sampling function, such that parameters appearing in the mixed Gaussian (mGaussian) function can be well determined by convolutional methods using the novel methodology for handling multiple-failure-regions provided herein. That is, once each of the different failure regions has been identified, or labeled, then instead of a single Gaussian distribution function for each failure region, a mixture of Gaussians (mGaussian) will be collectively used as a single IS sampling distribution function, wherein each Gaussian function may be improved using probability collectives or regression models, etc. For example, an automated method may be used to construct the mGaussian function to provide a closed-form loop encompassing all of the individual failure regions (e.g., based on convolution calculation without user input).

At S206, which may be a final integration step, once a sufficient number of iterations are performed such that sufficient information is obtained with respect to the one or more failure regions to enable construction of a single suitable mGaussian function covering multiple failure regions, the most recently obtained mean and sigma values may be used to perform MC simulations using the improved sample distribution to identify the failure samples. Accordingly, even with a fixed simulation budget (e.g., a simulation budget using the original distribution or sampling function), a higher accuracy level is achieved. It should further be noted that the methods of the described embodiments are compatible with existing ISMC and other "high-sigma" yield evaluation methods.

Suitable sample sizes N1, N2, and N3 may be selected by user input to adjust the sample sizes to suit specifications of the simulation. Although the present invention is not limited thereto, the sample sizes N1 and N3 may be larger than the sample size N2 because, for example, convergence may require a different number of loops or iterations. Accordingly, a user may select some criterion or criteria for the convergence of the mean and sigma values.

Figure 3B:
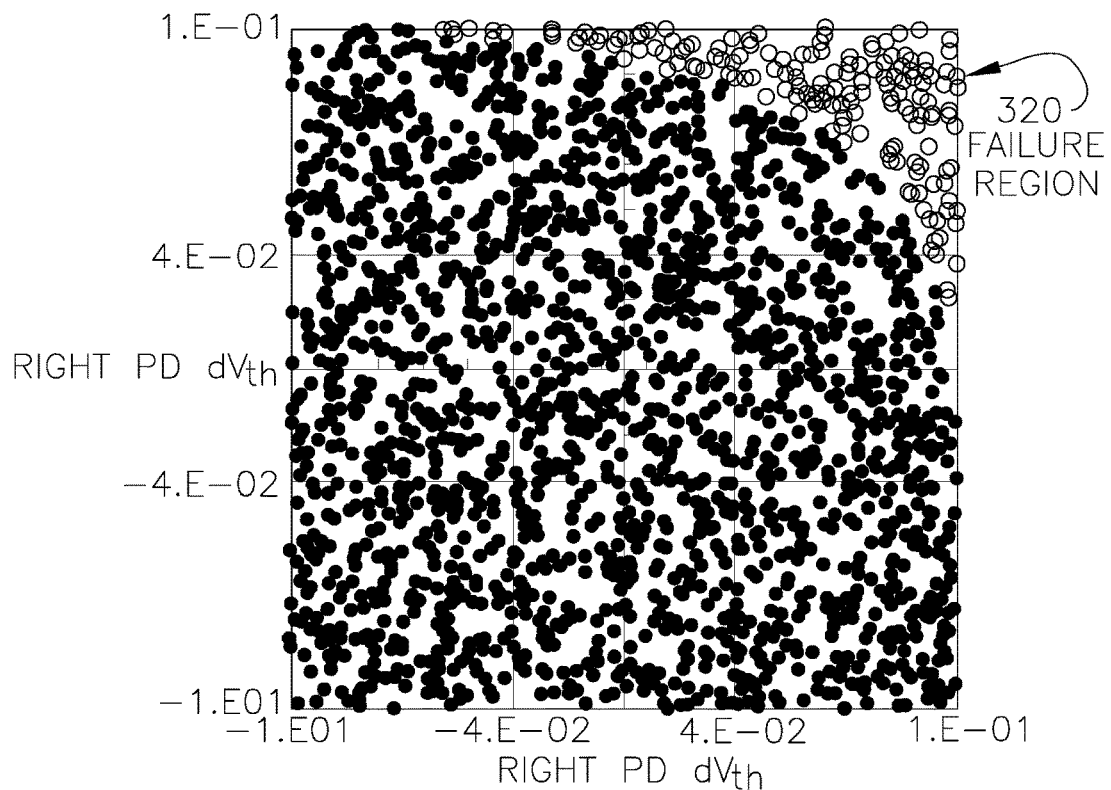
FIG. 3B depicts a uniform sampling for detecting a failure region, according to an embodiment of the present invention.
Figure 3C:
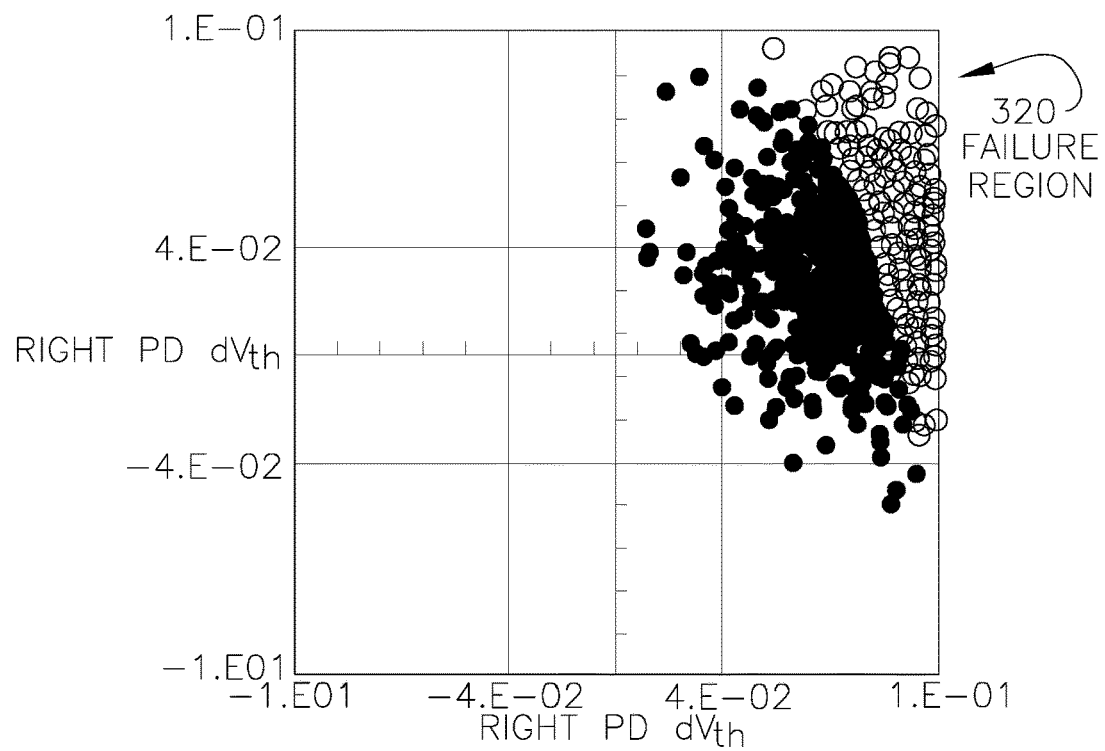
FIG. 3C depicts a targeted sampling focused on the failure region detected by the uniform sampling of FIG. 3B.
Figure 3D:
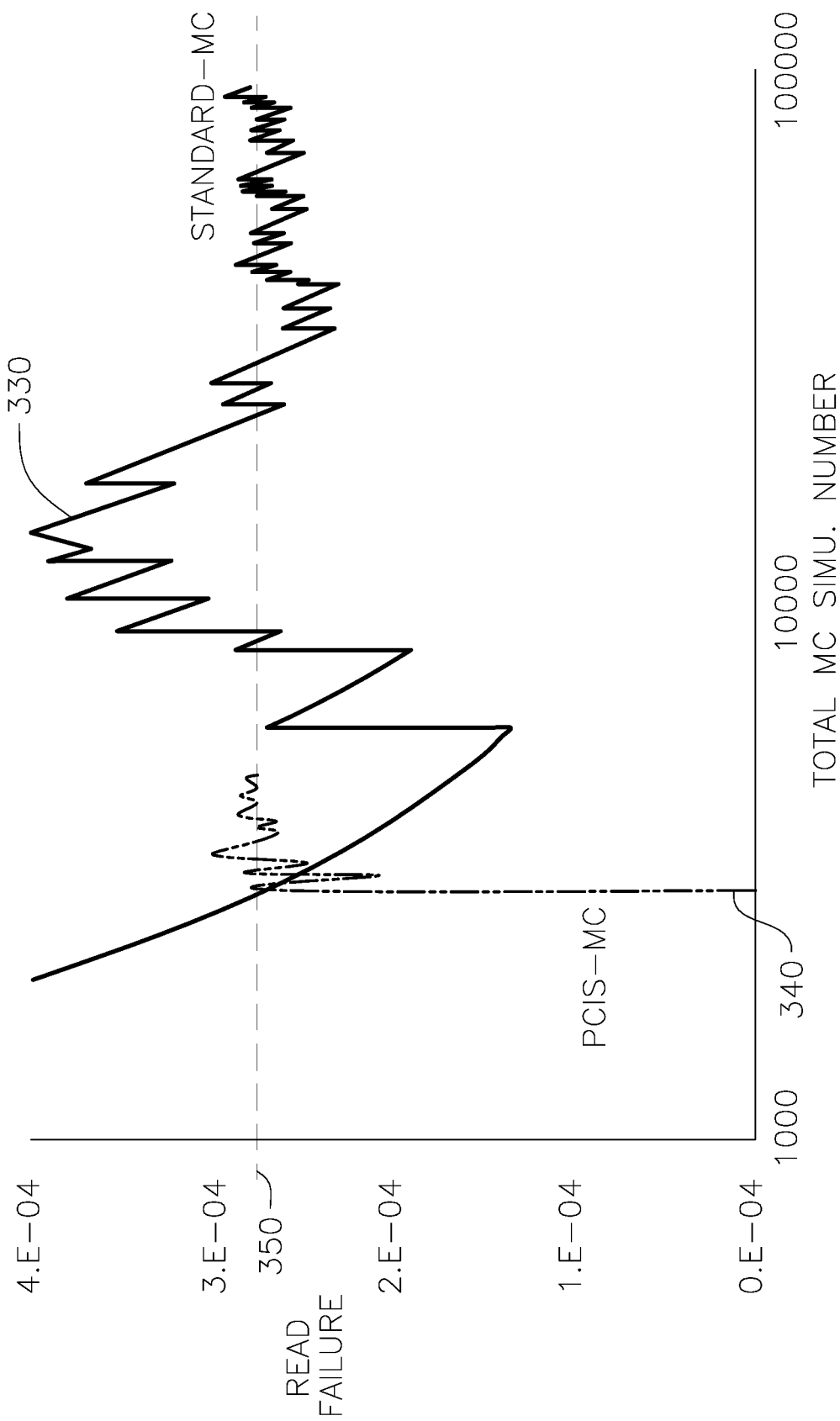
FIG. 3D depicts a comparison of convergence resulting from standard Monte Carlo simulations, and convergence resulting from importance sampling Monte Carlo simulations, according to an embodiment of the present invention.

FIG. 3A depicts a circuit diagram of a 6T-SRAM circuit, FIG. 3B depicts a uniform sampling for detecting a failure region, according to an embodiment of the present invention, FIG. 3C depicts a targeted sampling focused on the failure region detected by the uniform sampling of FIG. 3B, and FIG. 3D depicts a comparison of convergence resulting from standard Monte Carlo simulations, and convergence resulting from importance sampling Monte Carlo simulations, according to an embodiment of the present invention.

Referring to FIG. 3A, an example of a circuit 300 having 6 transistors 310 each corresponding to a variable analyzed for determining the failure regions. For example, improved ISMC methods may be performed during 6T-SRAM yield analysis on the 6T-SRAM circuit 300 shown in FIG. 3A. It should be noted that two-dimensional analysis corresponding to only two of the transistors 310 is shown in FIGS. 3B and 3C for the purpose of illustration, although the 6T-SRAM yield analysis may be performed in 6-dimensional variable space (i.e., a variable space dimension of six).

Referring to FIG. 3B a single failure region 320 (e.g., a single cluster) is detected by performing uniform sampling (e.g., in accordance with S201 described with respect to FIG. 2 above). In the present example, the samples are not uniform due to the existence of the failure region 3250 that is detected primarily in a first quadrant, or upper right corner of FIG. 3B.

Referring to FIG. 3C, a probability collective method may be performed (e.g., in accordance with S202, S203, and S204 described with respect to FIG. 2 above) to improve the IS distribution function such that a higher percentage of the samples are failure samples. That is, by improving the redistribution function to be further in the failure region 320, a denser amount of samples are placed in the failure region 320. The simulations may include, for example, BSIM-4 models for transistors at 20 LP, VDD=0.90V, and Bitline capacitance of 0.1 pF. Additionally, and for example, the variability may assume Vth variability, such that $\sigma Vt,PD=25$ mV, $\sigma Vt,PU=30$ mV, and $\sigma Vt,PG=30$ mV.

Referring to FIG. 3D, the improved IS function may be used to perform Monte Carlo simulations (e.g., in accordance with S206 described with respect to FIG. 2 above). It should be noted that FIG. 3D also depicts convergence as a result of standard Monte Carlo simulations 330 for comparison. As shown, the improved PCIS-MC simulations 340 use fewer simulations than the Standard Monte Carlo simulations 330 to converge to the final failure mark indicated by the dashed line 350.

FIG. 4 depicts identification of possible failure regions for different variables corresponding to the 6T-SRAM circuit of FIG. 3 as identified using the method of FIG. 2, according to an embodiment of the present invention.

Referring to FIG. 4, for some specification changes of the 6T-SRAM circuit evaluation, a critical problem may be a result of mismatch due to symmetry of SRAM circuit topology (e.g., two left inverters, and two right inverters). If a mismatch between a pair of the inverters occurs, convergence of the IS function at only one of the failure regions may ignore a separate failure region, thereby resulting in erroneous analysis. However, the clustering algorithms discussed above with respect to S203 ensure that all failure regions are considered. For example, with reference to the STATIC HOLD and STATIC READ depicted in FIG. 4, the optimal number of clusters is identified as being equal to 2, in accordance with embodiments of the present invention.

Figure 5:
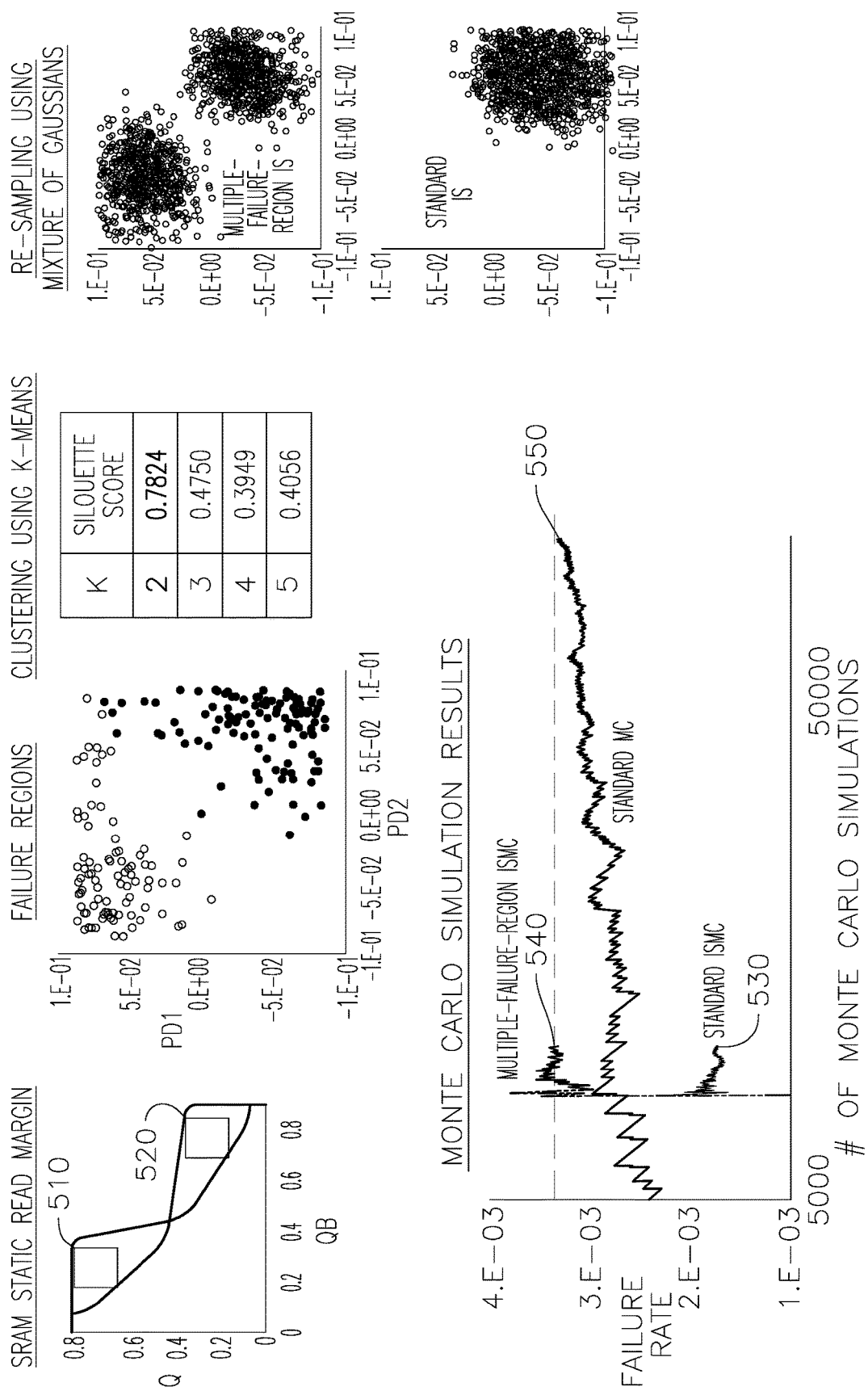
FIG. 5 depicts benefits achieved by clustering using the method of FIG. 2, according to an embodiment of the present invention.

FIG. 5 depicts benefits achieved by clustering using the method of FIG. 2, according to an embodiment of the present invention.

Referring to FIG. 5, the clustering algorithms discussed with respect to S203 of FIG. 2 above may account for the SRAM read margin, for example, such that the read margin may be measured by minimum squares of an upper branch 510 and a lower branch 520. By creating a mismatch such that either one will fail to generate the shown failure pattern, by performing the clustering algorithm to detect two clusters, and by scoring the clusters, two Gaussian functions may be used to respectively sample the two clusters.

Accordingly, as discussed with respect to S205 of FIG. 2 above, the two individual Gaussian functions may be integrated to allow for multiple-failure-region importance sampling using a single mGaussian function. As can be seen in FIG. 5, the standard ISMC 530 (single cluster) will converge at a rate that is different than the convergence rate of the multiple-failure-region ISMC 540, although both will converge more quickly than the standard Monte Carlo simulation 550.

Figure 6:
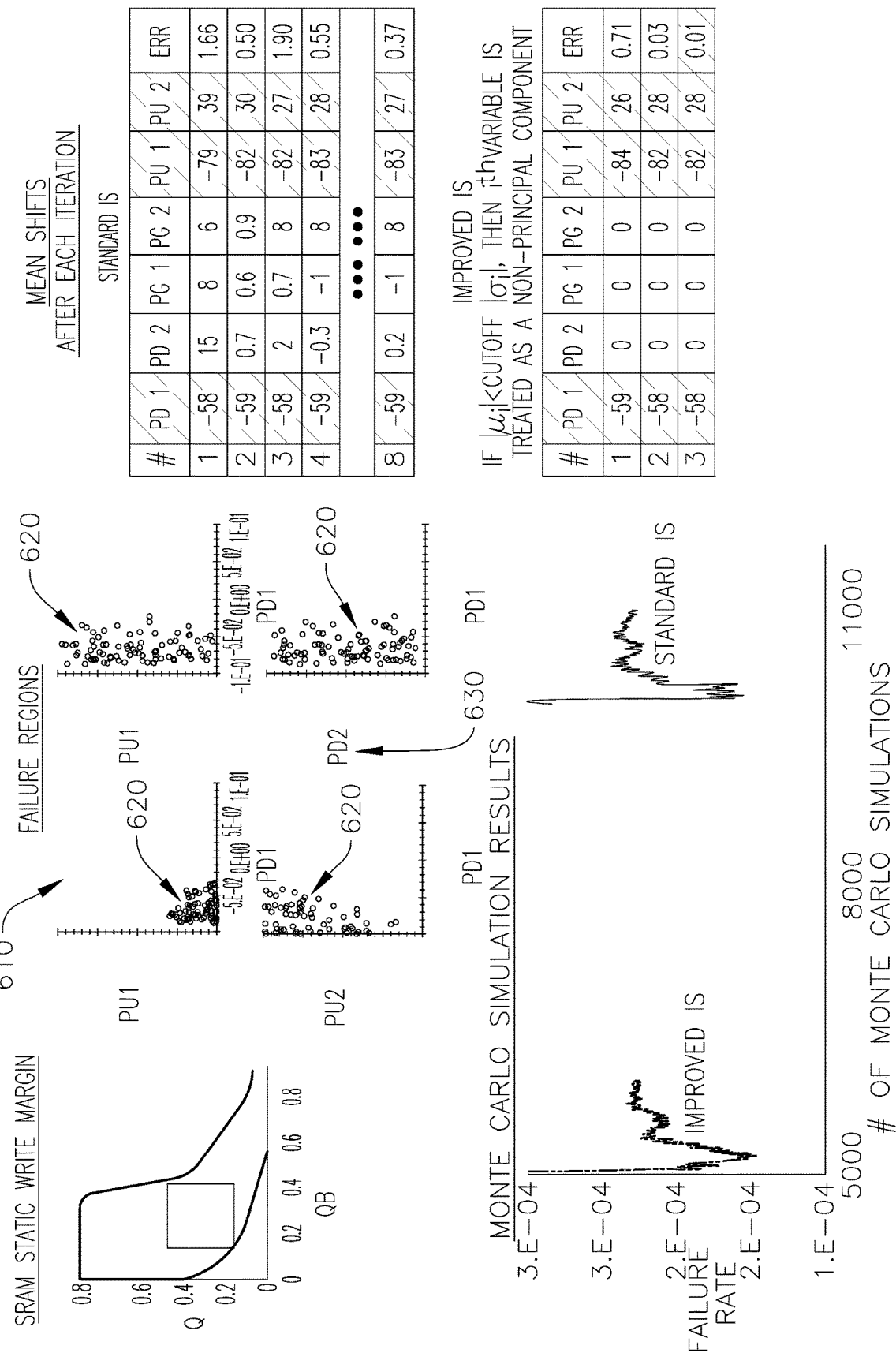
FIG. 6 depicts benefits achieved by feature filtering using the method of FIG. 2.

FIG. 6 depicts benefits achieved by feature filtering using the method of FIG. 2.

Referring to FIG. 6, in the present example, two variables are projected for ease of description, although there is a total of six variables respectively associated with the transistors of the 6T-SRAM circuit. Further, in the present example, all of the samples result from the same failure device with the different failure regions being projected into different spaces and different dimensions.

Further, it can be seen in the failure regions 610 of FIG. 6 that the distribution of failure samples 620 occurs in a large section of a range of the variables. Accordingly, the variables are normalized at zero such that zero is the mean. Additionally, because the failure samples may be distributed almost uniformly over an entirety of the variable range, it may be deduced that the corresponding variable (e.g., variable PD2 630) is not a limiting factor of the failure rate. However, by projecting the same failure samples into PD1 and PU1, it appears that the failure samples occupy a particular failure region, indicating a relatively small failure region to be detected for further analysis.

Upon determining which variable/dimension is critical, and by applying a feature filtering/dimension reduction technique for those unimportant, non-critical variables (e.g., in accordance with S202 described above), the reference IS may be improved enabling convergence with fewer iterations.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A method of circuit yield analysis, the method comprising:
   detecting a plurality of failed samples respectively located at a plurality of failure regions in a multi-dimensional parametric space;
   clustering the failed samples to identify the failure regions;
   filtering features of the failed samples to determine a parameter component that is a non-principal component in affecting circuit yield;
   applying a dimensional reduction method on a dimension corresponding to the parameter component; and
   constructing a final importance sampling (IS) distribution function using a mixed Gaussian (mGaussian) function corresponding to all of the failure regions containing a rare failure event.

2. The method of claim 1, further comprising optimizing an importance sampling (IS) distribution function corresponding to each of the failure regions.

3. The method of claim 2, wherein optimizing the importance sampling (IS) distribution function corresponding to each of the failure regions comprises performing at least one of sequential importance sampling, probability collectives, or regression-based sampling.

4. The method of claim 1, further comprising:
   collecting the failed samples at each of the failure regions; and
   calculating a final failure probability.

5. The method of claim 1, further comprising performing at least one of uniform sampling, orthogonal sampling, Latin-Hypercube sampling, or Sobol sampling to detect the plurality of failed samples.

6. The method of claim 1, wherein clustering comprises performing at least one of hierarchical clustering, K-means clustering, Expectation-Maximization clustering, or density-based clustering.

7. The method of claim 1, wherein clustering comprises using evaluation algorithms to score and determine a clustering strategy.

8. The method of claim 7, wherein using evaluation algorithms comprises using at least one of a Davis-Bouldin index, a Dunn index, a Jaccard index, an F-measure, or a Silhouette coefficient.

9. The method of claim 1, further comprising parameterizing the mGaussian function.

10. The method of claim 9, wherein parameterizing the mGaussian function comprises performing at least one of closed-form calculations or convolutional calculations.

11. The method of claim 1, wherein applying the dimensional reduction method comprises at least one of principal-component-analysis or filtering.

12. A system for circuit yield analysis, the system comprising:
   a processor; and
   a memory having instructions stored thereon that, when executed by the processor, cause the processor to:
      detect a plurality of failed samples respectively located at a plurality of failure regions in a multi-dimensional parametric space;
      cluster the failed samples to identify the failure regions;
      filter features of the failed samples to determine a parameter component that is a non-principal component in affecting circuit yield;
      apply a dimensional reduction method on a dimension corresponding to the parameter component; and
      construct a final importance sampling (IS) distribution function using a mixed Gaussian (mGaussian) function corresponding to all of the failure regions containing a rare failure event.

13. The system of claim 12, wherein the instructions further cause the processor to optimize an importance sampling (IS) distribution function corresponding to each of the failure regions.

14. The system of claim 13, wherein the instructions, when executed by the processor, cause the processor to optimize the importance sampling (IS) distribution function corresponding to each of the failure regions by performing at least one of sequential importance sampling, probability collectives, or regression-based sampling.

15. The system of claim 12, wherein the instructions, when executed by the processor, further cause the processor to:
   collect the failed samples at each of the failure regions; and
   calculate a final failure probability.

16. The system of claim 12, wherein the instructions, when executed by the processor, cause the processor to perform at least one of uniform sampling, orthogonal sampling, Latin-Hypercube sampling, or Sobol sampling to detect the plurality of failed samples.

17. The system of claim 12, wherein the instructions, when executed by the processor, cause the processor to cluster by performing at least one of hierarchical clustering, K-means clustering, Expectation-Maximization clustering, or density-based clustering.

18. The system of claim 12, wherein the instructions, when executed by the processor, cause the processor to cluster by using evaluation algorithms to score and determine a clustering strategy.

19. The system of claim 12, wherein the instructions, when executed by the processor, further cause the processor to parameterize the mGaussian function.

20. The system of claim 19, wherein the instructions, when executed by the processor, cause the processor to parameterize the mGaussian function by performing at least one of closed-form calculations or convolutional calculations.

21. The system of claim 12, wherein the instructions, when executed by the processor, cause the processor to apply the dimensional reduction method by at least one of principal-component-analysis or filtering.

* * * * *